(12) United States Patent
Park (10) Patent No.: US 9,530,756 B2
(45) Date of Patent: Dec. 27, 2016

(54) SEMICONDUCTOR APPARATUS HAVING ELECTRICAL CONNECTIONS WITH THROUGH-VIA AND A METAL LAYER AND STACKING METHOD THEREOF

(71) Applicant: SK hynix Inc., Icheon-si Gyeonggi-do (KR)

(72) Inventor: Min Su Park, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 53 days.

(21) Appl. No.: 14/665,695

(22) Filed: Mar. 23, 2015

(65) Prior Publication Data

US 2016/0163678 A1 Jun. 9, 2016

(30) Foreign Application Priority Data

Dec. 8, 2014 (KR) ........................ 10-2014-0175032

(51) Int. Cl.
| | |
|---|---|
| *H01L 23/38* | (2006.01) |
| *H01L 25/065* | (2006.01) |
| *H01L 23/48* | (2006.01) |
| *H01L 23/00* | (2006.01) |

(52) U.S. Cl.
CPC ......... *H01L 25/0657* (2013.01); *H01L 23/481* (2013.01); *H01L 24/06* (2013.01); *H01L 24/14* (2013.01); *H01L 2224/13025* (2013.01); *H01L 2224/14181* (2013.01); *H01L 2224/16146* (2013.01); *H01L 2225/06513* (2013.01); *H01L 2225/06527* (2013.01); *H01L 2225/06541* (2013.01); *H01L 2225/06544* (2013.01); *H01L 2225/06562* (2013.01); *H01L 2225/06565* (2013.01)

(58) Field of Classification Search
CPC ............................... H01L 23/481; H01L 23/38
See application file for complete search history.

(56) References Cited

U.S. PATENT DOCUMENTS

2015/0084205 A1* 3/2015 Lin ..................... H01L 23/5384
    257/774
2015/0179543 A1* 6/2015 Tan .......................... H01L 23/38
    62/3.7

FOREIGN PATENT DOCUMENTS

| KR | 1020100089040 A | 8/2010 |
| KR | 101071761 B1 | 10/2011 |

* cited by examiner

*Primary Examiner* — Marc Armand
(74) *Attorney, Agent, or Firm* — William Park & Associates Ltd.

(57) ABSTRACT

A semiconductor apparatus may include a first metal layer including a first unit pad. The semiconductor apparatus may include a second metal layer including first and second unit pads. The semiconductor apparatus may include a first through-via coupling the first unit pad of the first metal layer to a first bump; and a second through-via coupling the first unit pad of the second metal layer to a second bump. The second unit pad of the second metal layer may be disposed in a first direction from the first unit pad of the second metal layer, and may be electrically coupled to the first unit pad of the second metal layer.

15 Claims, 7 Drawing Sheets

SEMICONDUCTOR APPARATUS HAVING ELECTRICAL CONNECTIONS WITH THROUGH-VIA AND A METAL LAYER AND STACKING METHOD THEREOF

CROSS-REFERENCES TO RELATED APPLICATION

The present application claims priority under 35 U.S.C. §119(a) to Korean application number 10-2014-0175032, filed on Dec. 8, 2014, in the Korean Intellectual Property Office, which is incorporated herein by reference in its entirety as set forth in full.

BACKGROUND

1. Technical Field

Various embodiments generally relate to a semiconductor apparatus, and more particularly, to a semiconductor apparatus having a plurality of stacked chips electrically coupled to one another by a through-via and a metal layer.

2. Related Art

In order to increase integration of a semiconductor apparatus, a 3 dimensional (3D) semiconductor apparatus has been proposed. A 3D semiconductor apparatus may include a plurality of chips stacked and packaged in a single package. The 3D semiconductor apparatus achieves maximum integration in given space by vertically stacking two or more chips.

According to some 3D semiconductor apparatuses, a plurality of the same type of chips are stacked and the plurality of the same type of chips are coupled to one another through metal line like wires. In this way, the plurality of the same type of chips operates as a single semiconductor apparatus.

Some 3D semiconductor apparatuses may implement "Through Silicon Via" (TSV) electrically coupling all of a plurality of stacked chips by penetrating the plurality of stacked chips with "via". A semiconductor apparatus having the TSV structure vertically penetrating and coupling each of the plurality of chips effectively reduces the size of the package better than a semiconductor apparatus utilizing the wire structure to couple each of the plurality of chips through edge-wiring.

In general, the location for each TSV in each of the plurality of stacked chips is formed at corresponding locations to match the locations of the other stacked chips. Therefore, when the chips are stacked, all of the stacked chips should be electrically coupled to one another. However, when there is a need to change the electrical connections of part of the stacked chips, the structure of the stacked chips would then need to be changed. These changes cause the costs to increase. Currently, 3D semiconductor apparatuses are developed depending on the function needed and in accordance with the electronic device comprising the 3D semiconductor apparatus. For example, a high-bandwidth semiconductor apparatus widens a bandwidth of the apparatus by allowing a plurality of stacked chips to operate independently from one another with a plurality of channels while the plurality of stacked chips form a single semiconductor apparatus.

SUMMARY

In an embodiment, a semiconductor apparatus may include a first metal layer including a first unit pad. The semiconductor apparatus may include a second metal layer including first and second unit pads. The semiconductor apparatus may include a first through-via coupling the first unit pad of the first metal layer to a first bump; and a second through-via coupling the first unit pad of the second metal layer to a second bump. The second unit pad of the second metal layer may be disposed in a first direction from the first unit pad of the second metal layer, and may be electrically coupled to the first unit pad of the second metal layer.

In an embodiment, a semiconductor apparatus may include a first stacked chip comprising a first metal layer including a first unit pad, and a second metal layer including a first unit pad and a second unit pad. The semiconductor apparatus may include a second stacked chip comprising a first metal layer including a first unit pad, and a second metal layer including a first unit pad and a second unit pad. The second unit pad of the second metal layer of the first stacked chip may be disposed in a first direction from the first unit pad of the second metal layer of the first stacked chip, and may be electrically coupled to the first unit pad of the second metal layer of the first stacked chip. The second unit pad of the second metal layer of the second stacked chip may be disposed in the first direction from the first unit pad of the second metal layer of the second stacked chip, and may be electrically coupled to the first unit pad of the second metal layer of the second stacked chip. The second stacked chip may be stacked over the first stacked chip and may be configured to be shifted from disposition of the first stacked chip by a predetermined distance in the first direction.

DETAILED DESCRIPTION

Hereinafter, a semiconductor apparatus according to the present invention will be described below with reference to the accompanying drawings through exemplary embodiments.

Various embodiments may be provided to a semiconductor apparatus capable of forming electrical connection between a base chip and a predetermined stacked chip among the plurality of stacked chips, and a stacking method thereof.

Figure 1:
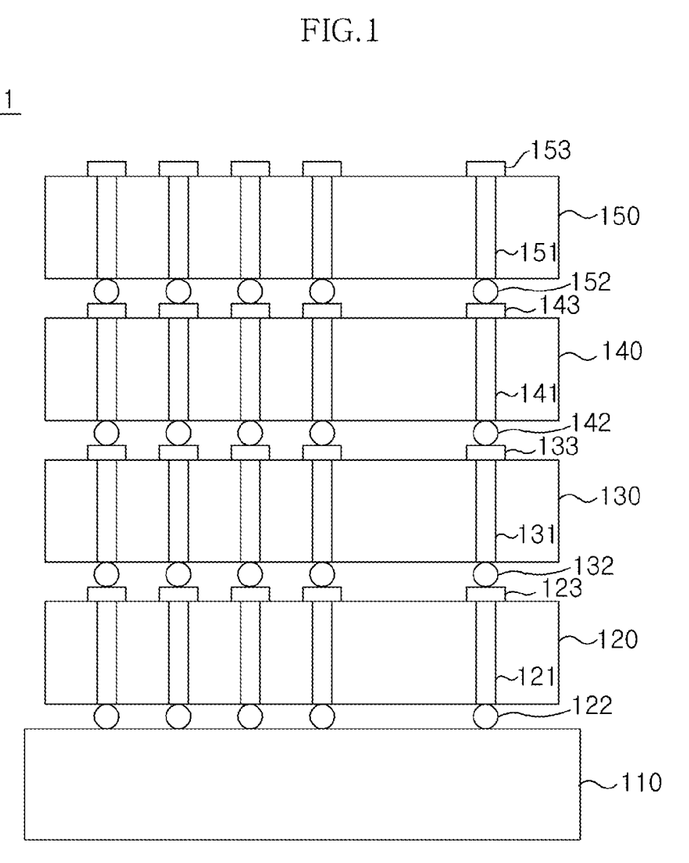
FIG. 1 is a schematic diagram illustrating a representation of an example of a semiconductor apparatus in accordance with an embodiment.

Referring to FIG. 1, the semiconductor apparatus 1 in accordance with an embodiment may include a base chip 110 and a plurality of stacked chips 120 to 150. The base chip 110 may be electrically coupled to an external device such as, for example but not limited to, a controller or a host. The base chip 110 may relay communication between the external device and the plurality of stacked chips 120 to 150. The plurality of stacked chips 120 to 150 may be sequentially stacked over the base chip 110. The plurality of stacked chips 120 to 150 and the base chip 110 may be formed as a single package to form the single semiconductor apparatus 1. The plurality of stacked chips 120 to 150 may include a plurality of through-vias 121, 131, 141 and 151 formed therein, respectively. The plurality of through-vias 121, 131, 141 and 151 may be electrically coupled to a plurality of bump balls 122, 132, 142 and 152, respectively. Each of the plurality of bump balls 122, 132, 142 and 152 may be a micro bump. A plurality of metal layers 123, 133, 143 and 153 may be formed over the plurality of stacked chips 120 to 150, respectively.

One or more of the plurality of stacked chips 120 to 150 may serve and/or operate as independent channels for increasing bandwidth of the semiconductor apparatus 1. For example, first to fourth stacked chips 120 to 150 may serve as first to fourth channels, respectively. For example, the first and second stacked chips 120 and 130 may serve as the first channel, and the third and fourth stacked chips 140 and 150 may serve as the second channel. The channel may mean, for example, a path capable of independently performing data communication. Mutually separated channels may independently receive a control signal such as a command signal, a chip selection signal and an address signal, and may commonly receive a signal such as data or a clock signal. Therefore, each of the plurality of stacked chips 120 to 150 may include a separated command bus and a separated address bus while a data bus and a clock bus may be shared by all of the plurality of stacked chips 120 to 150. A data bus and a clock bus commonly coupled to all of the plurality of stacked chips 120 to 150 may be formed because of the electrical connections from the base chip 110 to all of the plurality of stacked chips 120 to 150 formed through the plurality of through-vias 121, 131, 141 and 151. The plurality of through-vias 121, 131, 141 and 151 formed in the plurality of stacked chips 120 to 150, respectively. However, each of the plurality of stacked chips 120 to 150 may independently receive the control signal such as the command signal, the chip selection signal or the address signal. All of the plurality of stacked chips 120 to 150 may not be electrically coupled to one another. For example, when the first to fourth stacked chips 120 to 150 may form the first to fourth channels, respectively, the first stacked chip 120 may be sufficient to be electrically coupled to the base chip 110 in order to receive the control signal. The second stacked chip 130 may be sufficient to be electrically coupled sequentially to the base chip 110 and the first stacked chip 120. In a similar manner, the third stacked chip 140 may be sufficient to be electrically coupled sequentially to the base chip 110, the first stacked chip 120, the second stacked chip 130 and the third stacked chip 140. Also, the fourth stacked chip 150 may be sufficient to be electrically coupled sequentially to the base chip 110, the first stacked chip 120, the second stacked chip 130 and the third stacked chip 140. Each stacked chip of the plurality of stacked chips 120 to 150 may be similar to one another, and as a result it may be difficult but possible with the various embodiments discussed herein to electrically couple between the base chip 110 and a particular chip from one of the plurality of stacked chips 120 to 150 in an individual way.

Figure 2:
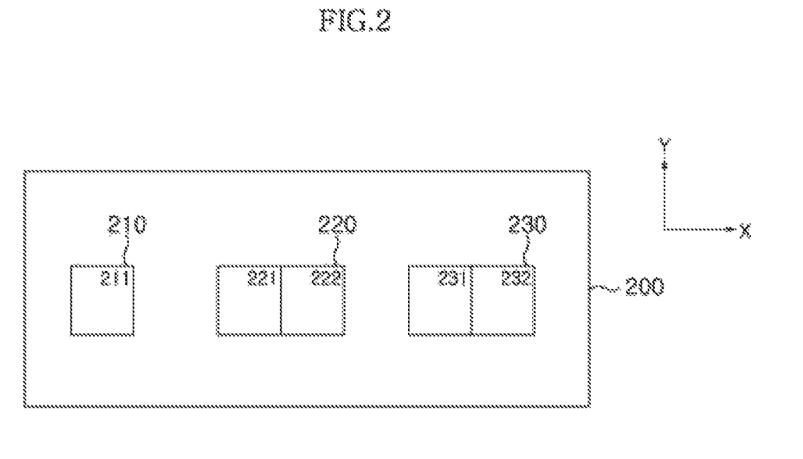
FIG. 2 is a schematic diagram illustrating a representation of an example of one of a plurality of stacked chips in accordance with an embodiment.

FIG. 2 is a schematic diagram illustrating a representation of an example of one (i.e., see FIG. 3, stacked chips 31 or 35) of the plurality of stacked chips (i.e., see FIG. 3, stacked chips 31 to 35) in accordance with an embodiment. Referring to FIG. 2, a stacked chip 200 of a plurality of stacked chips (i.e., 31 to 35) in accordance with an embodiment may include a first metal layer 210 and a second metal layer 220. The first metal layer 210 may include a first unit pad 211. FIG. 2 illustrates the first unit pad 211 having the shape of a square, although the first unit pad 211 is not limited to this shape and may be any other type of shape. For example, the first unit pad 211 may have the shape of a circle, a, ellipse, a rectangle, and so forth. The second metal layer 220 may include first and second unit pads 221 and 222. The second unit pad 222 may be disposed in a first direction from the first unit pad 221, and may be electrically coupled to the first unit pad 221. The first direction may be in the X direction of the X-axis as illustrated in FIG. 2. As illustrated in FIG. 2, for example, the second unit pad 222 may be located to the right of the first unit pad 221 with regards to the X-axis. For example, the first and second unit pads 221 and 222 may be formed together. In some embodiments, the first and second unit pads 221 and 222 may be separately located in disposition while electrically coupled to each other in connection. The separated first and second unit pads 221 and 222 with electrical coupling between may form a structure to look substantially like a dumbbell. The second unit pad 222 may be substantially the same as the first unit pad 221 in shape. FIG. 2 illustrates each of the first and second unit pads 221 and 222 having the shape of a square, although the first and second unit pads 221 and 222 are not limited to these shapes and may be any other type of shape. For example, each of the first and second unit pads 221 and 222 may have the shape of a circle, a, ellipse, a rectangle, and so forth. The first and second metal layers 210 and 220 may be formed over or under the stacked chip 200. The first unit pads 211 and 221 of the first and second metal layers 210 and 220 may be electrically coupled to the through-vias formed in the stacked chip 200. Hereinafter, the first metal layer 210 may represent the metal layer including a single unit pad, and the second metal layer 220 may represent the metal layer including a pair of unit pads.

The stacked chip 200 may include another second metal layer 230. The second metal layer 230 may include the first and second unit pads 231 and 232. The second unit pad 232 may be disposed in a first direction from the first unit pad 231, and may be electrically coupled to the first unit pad 231. For example, the first and second metal layers 210 and 220 may be provided to independently receive the control signal such as the command signal, the chip selection signal and the address signal for independently controlling each of the plurality of stacked chips 120 to 150 included in the semiconductor apparatus 1 while the second metal layer 230 may be provided in order to receive the common signal such as data and the clock signal shared by all of the plurality of stacked chips 120 to 150. FIG. 2 illustrates each of the first and second unit pads 231 and 232 having the shape of a square, although the first and second unit pads 231 and 222 are not limited to these shapes and may be any other type of shape. For example, each of the first and second unit pads 231 and 232 may have the shape of a circle, a, ellipse, a rectangle, and so forth.

Figure 3:
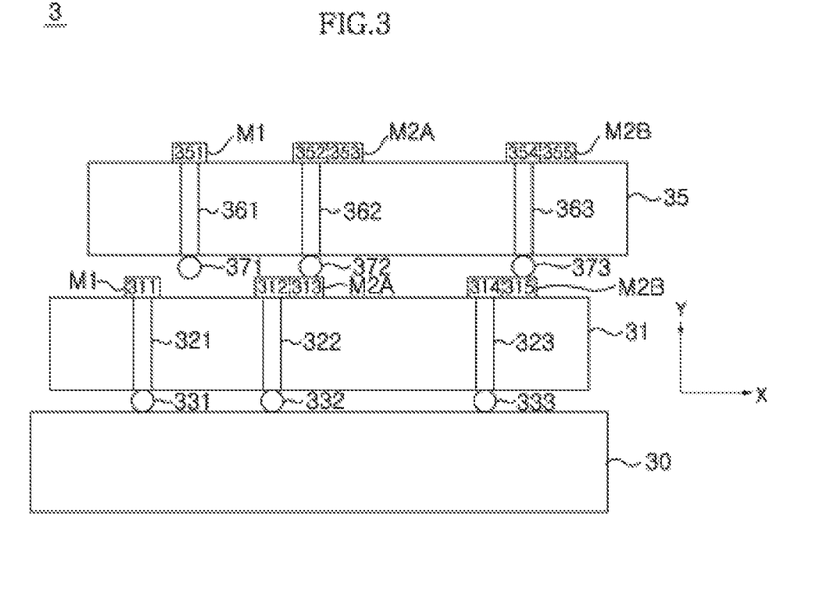
FIG. 3 is a schematic diagram illustrating a representation of an example of a semiconductor apparatus having a stacked structure of a base chip and a stacked chip illustrated in FIG. 2.

FIG. 3 is a schematic diagram illustrating a representation of an example of a semiconductor apparatus 3 having a stacked structure including a base chip 30 and stacked chips 31 and 35 (i.e., stacked chip 200 illustrated in FIG. 2). Referring to FIG. 3, first and second stacked chips 31 and 35 may be substantially the same as each other. For example, the first and second stacked chips 31 and 35 may respectively have the metal layers respectively disposed at the same or substantially the same locations, and the through-vias and the bumps respectively disposed at the same or substantially the same locations. The first stacked chip 31 may include a first metal layer M1 and second metal layers M2A and M2B. The second stacked chip 35 may include a first metal layer M1 and second metal layers M2A and M2B. The first metal layer M1 may include the first unit pads 311 and 351. The second metal layers M2A and M2B may include the first unit pads 312, 314, 352 and 354 and the second unit pads 313, 315, 353 and 355, respectively. The through-via formed to penetrate the first stacked chip 31 may be coupled to the first unit pad of the metal layer formed over the first stacked chip 31. The first through-via 321 formed in the first stacked chip 31 may be coupled to the first unit pad 311 of the first metal layer M1 at one end thereof and may be coupled to the bump 331 at the other end thereof. The second through-via 322 formed in the first stacked chip 31 may be coupled to the first unit pad 312 of the second metal layer M2A at one end thereof and may be coupled to the bump 332 at the other end thereof. The third through-via 323 formed in the first stacked chip 31 may be coupled to the first unit pad 314 of the second metal layer M2B at one end thereof and may be coupled to the bump 333 at the other end thereof. Although not illustrated, the bumps 331, 332 and 333 may be coupled to the other ends of the through-vias 321, 322 and 323 through other metal layers, respectively.

The through-via formed to penetrate the second stacked chip 35 may be coupled to the first unit pad of the metal layer formed over the second stacked chip 35. The first through-via 361 formed in the second stacked chip 35 may be coupled to the first unit pad 351 of the first metal layer M1 at one end thereof and may be coupled to the bump 371 at the other end thereof. The second through-via 362 formed in the second stacked chip 35 may be coupled to the first unit pad 352 of the second metal layer M2A at one end thereof and may be coupled to the bump 372 at the other end thereof. The third through-via 363 formed in the second stacked chip 35 may be coupled to the first unit pad 354 of the second metal layer M2B at one end thereof and may be coupled to the bump 373 at the other end thereof.

The first stacked chip 31 may be stacked over the base chip 30. The second stacked chip 35 may be stacked over the first stacked chip 31 to be shifted from disposition of the first stacked chip 31 by a predetermined distance in a first direction. For example, the first direction may be in the direction of the X-axis, and the predetermined distance may be the length of a unit pad. For example, as illustrated in FIG. 3 the second stacked chip 35 may be shifted to the right with regards to the X-axis. As illustrated in FIG. 3, the second stacked chip 35 may be stacked over the first stacked chip 31 to be shifted from disposition of the first stacked chip 31, and thus the first metal layer M1 coupled to the first through-via 321 of the first stacked chip 31 may be electrically disconnected from the second stacked chip 35. The first stacked chip 31 may be electrically coupled to the base chip 30 through the first through-via 321 while the first stacked chip 31 may be electrically disconnected from the second stacked chip 35.

The shifted disposition of the second stacked chip 35 from the first stacked chip 31 may electrically couple the bump 372 of the second stacked chip 35 and the second unit pad 313 of the second metal layer M2A of the first stacked chip 31. The second through-via 362 of the second stacked chip 35 may be electrically coupled to the first stacked chip 31 through the second unit pad 313 of the second metal layer M2A of the first stacked chip 31. The first unit pad 312 of the second metal layer M2A of the first stacked chip 31 may be coupled to the second through-via 322 of the first stacked chip 31, and the first unit pad 312 may be electrically coupled to the second unit pad 313, and therefore there may be electrical connection among the base chip 30, the first stacked chip 31 and the second stacked chip 35. The shifted disposition of the second stacked chip 35 from the first stacked chip 31 may electrically couple the bump 373 of the second stacked chip 35 and the second unit pad 315 of the second metal layer M2B of the first stacked chip 31. Therefore, the second through-via 363 of the second stacked chip 35 may be electrically coupled to the first stacked chip 31 through the second unit pad 315 of the second metal layer M2B of the first stacked chip 31. The first unit pad 314 of the second metal layer M2B of the first stacked chip 31 may be coupled to the third through-via 323 of the first stacked chip 31, and the first unit pad 314 may be electrically coupled to the second unit pad 315, and therefore there may be electrical connection among the base chip 30, the first stacked chip 31 and the second stacked chip 35.

With the shifted stack structure as described above, the first metal layer M1 and the first through-vias 321 and 361 of the first and second stacked chip 31 and 35 may form the electrical connection from the base chip 30 to the first stacked chip 31, but may electrically disconnect from the base chip 30 to the second stacked chip 35. Also, with the shifted stack structure as described above, the second metal layers M2A and M2B and the second and third through-vias 322, 323, 362 and 363 of the first and second stacked chip 31 and 35 may form the electrical connection from the base chip 30 to the first stacked chip 31 and the second stacked chip 35 through the second metal layers M2A and M2B. When the first stacked chip 31 forms the first channel and the second stacked chip 35 forms the second channel, a signal from the base chip 30 to the first stacked chip 31 through the first through-via 321 of the first stacked chip 31 may be the control signal for controlling the first stacked chip 31 only, and a signal from the base chip 30 to the second stacked chip 35 through the second through-via 322 of the first stacked chip 31 and the second through-via 362 of the second stacked chip 35 may be the control signal for controlling the second stacked chip 35 only. In an embodiment, a signal from the base chip 30 to the first stacked chip 31 and the second stacked chip 35 through the second through-via 322 of the first stacked chip 31 and the second through-via 362 of the second stacked chip 35 may be the control signal for controlling both of the first stacked chip 31 and the second stacked chip 35. A signal from the base chip 30 to the first stacked chip 31 and the second stacked chip 35 through the third through-via 323 of the first stacked chip 31 and the third through-via 363 of the second stacked chip 35 may be the common signal for both of the first and second stacked chips 31 and 35.

Figure 4:
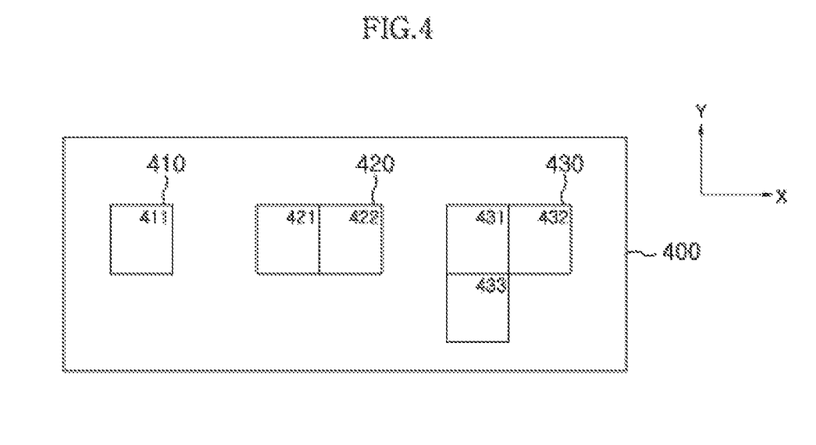
FIG. 4 is a schematic diagram illustrating a representation of an example of one of a plurality of stacked chips in accordance with an embodiment.

FIG. 4 is a schematic diagram illustrating a representation of an example of one (i.e., see FIG. 5, stacked chips 51, 53, or 55) of a plurality of stacked chips (i.e., see FIG. 5, stacked chips 51 to 55) in accordance with an embodiment. Referring to FIG. 4, a stacked chip 400 of a plurality of stacked chips (i.e., 51-55) in accordance with an embodiment may include a first metal layer 410, a second metal layer 420 and a third metal layer 430. The first metal layer 410 may include a first unit pad 411. The second metal layer 420 may include a first unit pad 421 and a second unit pad 422. The second unit pad 422 may be disposed in a first direction from the first unit pad 421, and may be electrically coupled to the first unit pad 421. The third metal layer 430 may include a first unit pad 431, a second unit pad 432 and a third unit pad 433. The second unit pad 432 may be disposed in the first direction from the first unit pad 431, and may be electrically coupled to the first unit pad 431. The third unit pad 433 may be disposed in a second direction from the first unit pad 431, and may be electrically coupled to the first unit pad 431. The first direction may be in the direction of the X-axis and the second direction may be in the direction of the Y-axis as illustrated in FIG. 4. As illustrated in FIG. 4, for example, the second unit pad 432 may be located to the right of the first unit pad 431 with regards to the X-axis. As illustrated in FIG. 4, for example, the third unit pad 433 may be located downward from the first unit pad 431 with regards to the Y-axis. Hereinafter, the third metal layer 430 may represent the metal layer including an amount of three unit pads.

Figure 5:
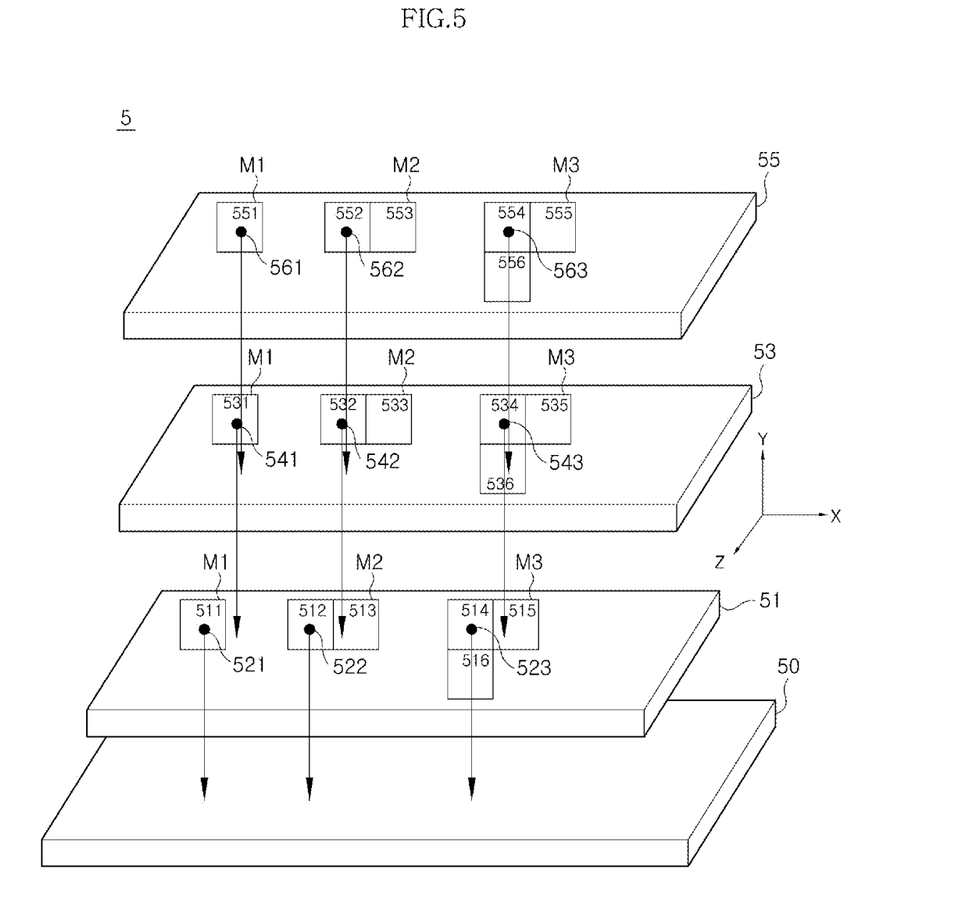
FIG. 5 is a schematic diagram illustrating a representation of an example of a semiconductor apparatus having a stacked structure of a base chip and a stacked chip illustrated in FIG. 4.

FIG. 5 is a schematic diagram illustrating a representation of an example of a semiconductor apparatus 5 having a stacked structure including a base chip 50 and stacked chips 51 to 55 (i.e., stacked chip 400 illustrated in FIG. 4). Referring to FIG. 5, the semiconductor apparatus 5 may include first to third stacked chips 51, 53 and 55. The first to third stacked chips 51, 53 and 55 may be substantially the same as each other. For example, the first to third stacked chips 51, 53, and 55 may respectively have the metal layers respectively disposed at the same or substantially the same locations, and the through-vias and the bumps respectively disposed at the same or substantially the same locations. The first to third stacked chips 51, 53 and 55 may include first to third metal layers M1, M2 and M3, respectively. The first metal layer M1 of the first stacked chip 51 may include the first unit pad 511. The second metal layer M2 of the first stacked chip 51 may include first and second unit pads 512 and 513. The third metal layer M3 of the first stacked chip 51 may include first to third unit pads 514, 515 and 516. The first metal layer M1 of the second stacked chip 53 may include the first unit pad 531. The second metal layer M2 of the second stacked chip 53 may include first and second unit pads 532 and 533. The third metal layer M3 of the second stacked chip 53 may include first to third unit pads 534, 535 and 536. The first metal layer M1 of the third stacked chip 55 may include the first unit pad 551. The second metal layer M2 of the third stacked chip 55 may include first and second unit pads 552 and 553. The third metal layer M3 of the third stacked chip 55 may include first to third unit pads 554, 555 and 556.

First to third through-vias 521, 522 and 523 formed to penetrate the first stacked chip 51 may be coupled to the first unit pads 511, 512 and 514 of the first to third metal layers M1 to M3 of the first stacked chip 51 at one ends thereof, respectively, and may be coupled to bumps (not illustrated) at the other ends thereof, respectively. First to third through-vias 541, 542 and 543 formed to penetrate the second stacked chip 53 may be coupled to the first unit pads 531, 532 and 534 of the first to third metal layers M1 to M3 of the second stacked chip 53 at one ends thereof, respectively, and may be coupled to bumps (not illustrated) at the other ends thereof, respectively. First to third through-vias 561, 562 and 563 formed to penetrate the third stacked chip 55 may be coupled to the first unit pads 551, 552 and 554 of the first to third metal layers M1 to M3 of the third stacked chip 55 at one ends thereof, respectively, and may be coupled to bumps (not illustrated) at the other ends thereof, respectively. FIG. 5 is illustrated with filled circles representing connections between the first unit pads of metal layers and the through-vias, and arrows representing electrical connections of the through-vias formed in the base chip 50 and the first to third stacked chips 51, 53 and 55.

The first stacked chip 51 may be stacked over the base chip 50. The second stacked chip 53 may be stacked over the first stacked chip 51 on the Y-axis to be shifted from disposition of the first stacked chip 51 by a predetermined distance in a first direction. For example, the first direction may be in the direction of the X-axis, and the predetermined distance may be the length of a unit pad. For example, as illustrated in FIG. 5 the second stacked chip 53 may be shifted to the right with regards to the X-axis. The third stacked chip 55 may be stacked over the second stacked chip 53 on the Y-axis to be shifted from disposition of the second stacked chip 53 by the predetermined distance in a second direction. The second direction may be the forward direction of the Z-axis, and the predetermined distance may be the length of the unit pad. Therefore, the third stacked chip 55 may become stacked over the first stacked chip 51 on the Y-axis to be shifted from the disposition of the first stacked chip 51 the predetermined distance in the first and second directions.

With the shifted stack structure as described above, the first metal layer M1 and the first through-via 521 of the first stacked chip 51 may form the electrical connection from the base chip 50 to the first stacked chip 51, but may electrically disconnected from the base chip 50 to the second stacked chip 53. The first metal layer M1 coupled to the first through-via 541 of the second stacked chip 53 may electrically disconnect from the third stacked chip 55. The second through-via 522 of the first stacked chip 51 may be coupled to the first unit pad 512 of the second metal layer M2, and the second through-via 542 of the second stacked chip 53 may be coupled to the second unit pad 513 of the second metal layer M2 of the first stacked chip 51. Therefore, the second through-via 522 of the first stacked chip 51 may be electrically coupled to the second through-via 542 of the second stacked chip 53 through the second metal layer M2. The second through-via 562 of the third stacked chip 55 may be electrically disconnected from the second metal layer M2 of the second stacked chip 53, and thus the second through-via 562 of the third stacked chip 55 may be electrically disconnected from the second through-via 542 of the second stacked chip 53. The third through-via 523 of the first stacked chip 51 may be coupled to the first unit pad 514 of the third metal layer M3, and the third through-via 543 of the second stacked chip 53 may be coupled to the second unit pad 515 of the third metal layer M3 of the first stacked chip 51. Also, the third through-via 543 of the second chip 53 may be coupled to the first unit pad 534 of the third metal layer M3 of the second stacked chip 53, and the third through-via 563 of the third stacked chip 55 may be coupled to the third unit pad 536 of the third metal layer M3 of the second stacked chip 53. Therefore, the third through-vias 523, 543 and 563 of the first to third stacked chips 51, 53 and 55 may be electrically coupled to one another through the third metal layers M3 disposed over the first to third stacked chips 51, 53 and 55. The first through-vias 521, 541 and 561 of the first to third stacked chips 51, 53 and 55 of the shifted stack structure having the first to third metal layers M1 to M3 may form the electrical connection between the base chip 50 and the first stacked chip 51, but may form the electrical disconnection between the first stacked chip 51 and the second and third stacked chips 53 and 55. The second through-vias 522, 542 and 562 of the first to third stacked chips 51, 53 and 55 may form the electrical connection among the base chip 50, the first stacked chip 51 and the second stacked chip 53, but may form the electrical disconnection between the second stacked chip 53 and the third stacked chip 55. The third through-vias 523, 543 and 563 of the first to third stacked chips 51, 53 and 55 may form the electrical connection among all of the base chip 50, the first stacked chip 51, the second stacked chip 53 and the third stacked chip 55. The base chip 50 may transmit a control signal for controlling only the first stacked chip 51 to the first stacked chip 51 through the first through-via 521 of the first stacked chip 51. The base chip 50 may transmit a control signal for controlling only the second stacked chip 53 or a control signal for controlling both of the first stacked chip 51 and the second stacked chip 53 to the first stacked chip 51 and the second stacked chip 53 through the second through-via 522 of the first stacked chip 51. The base chip 50 may transmit a control signal for controlling only the third stacked chip 55 or a control signal for controlling all of the first to third stacked chips 51, 53 and 55 to the first to third stacked chips 51, 53 and 55 through the third through-via 523 of the first stacked chip 51. Another third metal layer and another through-via coupled to the third metal layer, which may be additionally provided, may relay a common signal for all of the first to third stacked chips 51, 53 and 55.

Figure 6:
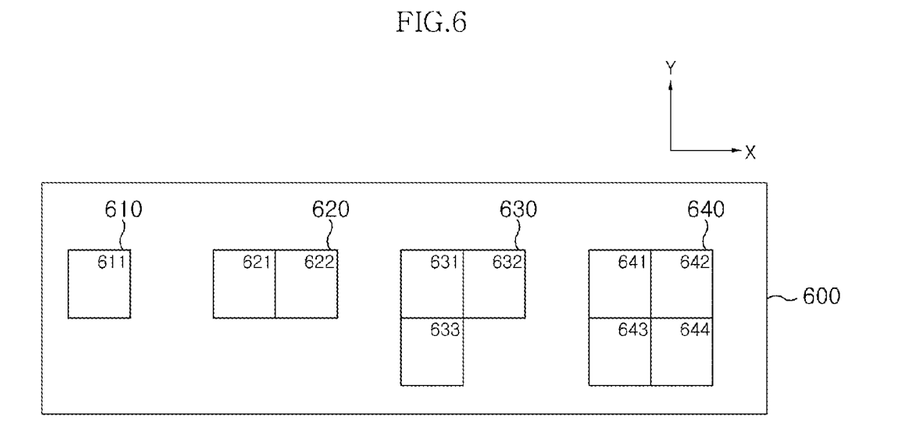
FIG. 6 is a schematic diagram illustrating a representation of an example of one of a plurality of stacked chips in accordance with an embodiment.

FIG. 6 is a schematic diagram illustrating a representation of an example of one (i.e., see FIG. 7, stacked chips 71, 73, 75, or 77) of a plurality of stacked chips (i.e., see FIG. 7, stacked chips 71-77) in accordance with an embodiment. Referring to FIG. 6, a stacked chip 600 of a plurality of stacked chips (i.e., 71-77) in accordance with an embodiment may include a first metal layer 610, a second metal layer 620, a third metal layer 630 and a fourth metal layer 640. The first metal layer 610 may include a first unit pad 611. The second metal layer 620 may include a first unit pad 621 and a second unit pad 622. The second unit pad 622 may be disposed in a first direction from the first unit pad 621, and may be electrically coupled to the first unit pad 621. The first direction may be in the X direction of the X-axis as illustrated in FIG. 6. As illustrated in FIG. 6, for example, the second unit pad 622 may be located to the right of the first unit pad 621 with regards to the X-axis. The third metal layer 630 may include a first unit pad 631, a second unit pad 632 and a third unit pad 633. The second unit pad 632 may be disposed in the first direction from the first unit pad 631, and may be electrically coupled to the first unit pad 631. The third unit pad 633 may be disposed in a second direction from the first unit pad 631, and may be electrically coupled to the first unit pad 631. The second direction may be in the Y direction of the Y-axis as illustrated in FIG. 6. As illustrated in FIG. 6, for example, the third unit pad 633 may be located downward from the first unit pad 631 with regards to the Y-axis.

The fourth metal layer 640 may include a first unit pad 641, a second unit pad 642, a third unit pad 633 and a fourth unit pad 644. The second unit pad 642 may be disposed in the first direction from the first unit pad 641, and may be electrically coupled to the first unit pad 641. The third unit pad 643 may be disposed in the second direction from the first unit pad 641, and may be electrically coupled to the first unit pad 641. The fourth unit pad 644 may be disposed in a third direction from the first unit pad 641, and may be electrically coupled to one of the second and third unit pads 642 and 643, or at least one of the second and third unit pads 642 and 643. The fourth unit pad 644 may be disposed under the second unit pad 642 on the Y-axis, and disposed to the right from the third unit pad 643 on the X-axis. Therefore, the third direction may be the diagonally downward direction to the right from the first unit pad 641 as illustrated in FIG. 6. FIG. 6, for example, illustrates the fourth unit pad 644 electrically coupled to both of the second and third unit pads 642 and 643.

Figure 7:
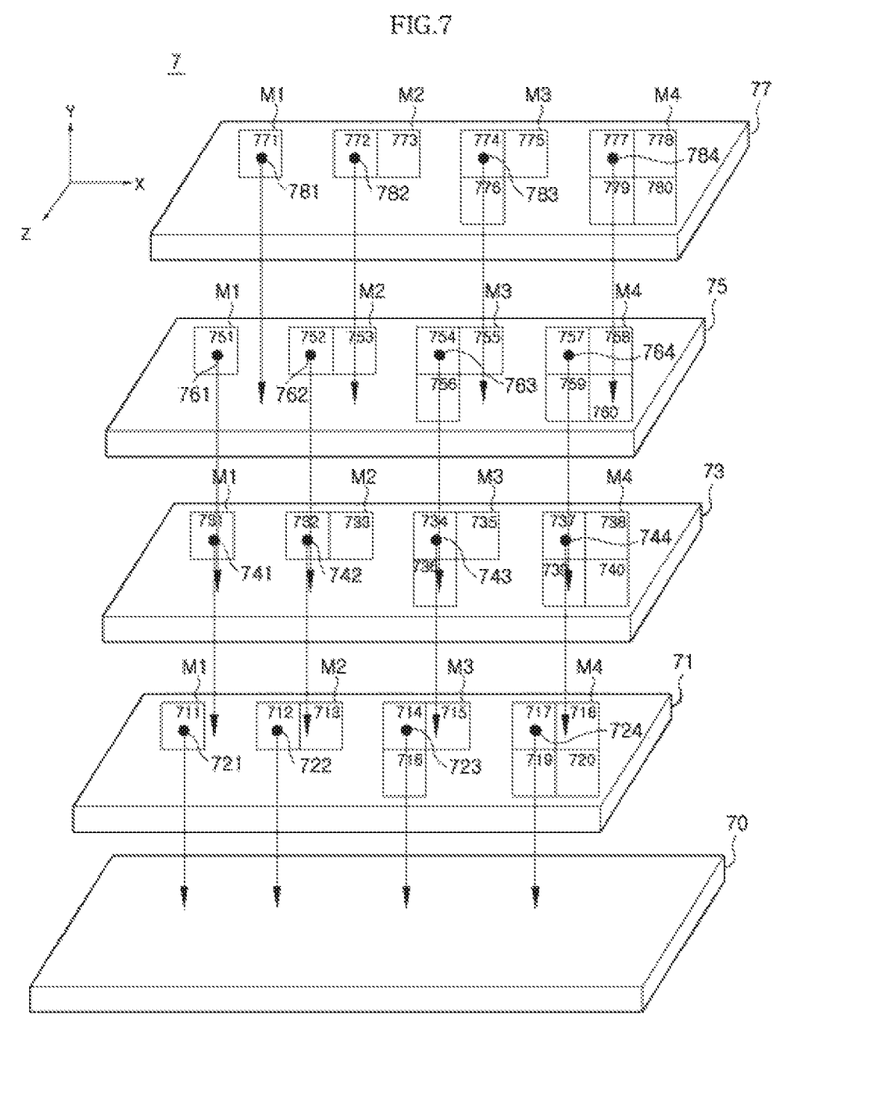
FIG. 7 is a schematic diagram illustrating a representation of an example of a semiconductor apparatus having a stacked structure of a base chip and a stacked chip illustrated in FIG. 6.

FIG. 7 is a schematic diagram illustrating a representation of an example of a semiconductor apparatus 7 having a stacked structure including a base chip 70 and stacked chips 71 to 77 (i.e., stacked chip 600 illustrated in FIG. 6). Referring to FIG. 7, the semiconductor apparatus 7 may include first to fourth stacked chips 71, 73, 75 and 77. The first to fourth stacked chips 71, 73, 75 and 77 may be substantially the same as each other. For example, the first to fourth stacked chips 71, 73, 75 and 77 may respectively have the metal layers respectively disposed at the same or substantially the same locations, and the through-vias and the bumps respectively disposed at the same or substantially the same locations.

The first stacked chip 71 may include first to fourth metal layers M1, M2, M3 and M4, first to fourth through-vias 721, 722, 723 and 724 formed to penetrate the first stacked chip 71, and bumps (not illustrated) coupled to the first to fourth through-vias 721, 722, 723 and 724. The first metal layer M1 may include a first unit pad 711. The second metal layer M2 may include first and second unit pads 712 and 713. The third metal layer M3 may include first to third unit pads 714, 715 and 716. The fourth metal layer M4 may include first to fourth unit pads 717, 718, 719 and 720. Similarly, each of the second to fourth stacked chips 73, 75 and 77 may include the first metal layer M1 having the first unit pad 731, 751 and 771. Similarly, each of the second to fourth stacked chips 73, 75 and 77 may include the second metal layer M2 having the first and second unit pads 732, 733, 752, 753, 772 and 773. Similarly, each of the second to fourth stacked chips 73, 75 and 77 may include the third metal layer M3 having the first to third unit pads 734, 735, 736, 754, 755, 756, 774, 775 and 776. Similarly, each of the second to fourth stacked chips 73, 75 and 77 may include the fourth metal layer M4 having the first to fourth unit pads 737, 738, 739, 740, 757, 758, 759, 760, 777, 778, 779 and 780. Also, each of the second to fourth stacked chips 73, 75 and 77 may include the first to fourth through-vias 741, 742, 743, 744, 761, 762, 763, 764, 781, 782, 783 and 784 formed to penetrate each of the second to fourth stacked chips 73, 75 and 77, and bumps (not illustrated) coupled to the first to fourth through-vias 741, 742, 743, 744, 761, 762, 763, 764, 781, 782, 783 and 784. The first to fourth through-vias 721, 722, 723, 724, 741, 742, 743, 744, 761, 762, 763, 764, 781, 782, 783 and 784 formed in the first to fourth stacked chips 71, 73, 75 and 77 may be coupled to the first unit pads 711, 712, 714, 717, 731, 732, 734, 737, 751, 752, 754, 757, 771, 772, 774 and 777 of the first to fourth metal layers M1, M2, M3 and M4, respectively. FIG. 7 illustrates filled circles representing the first to fourth through-vias 721, 722, 723, 724, 741, 742, 743, 744, 761, 762, 763, 764, 781, 782, 783 and 784.

The first stacked chip 71 may be stacked over the base chip 70 on the Y-axis. The second stacked chip 73 may be stacked over the first stacked chip 71 on the Y-axis to be shifted from disposition of the first stacked chip 71 by a predetermined distance in the first direction. For example, as illustrated in FIG. 7, the second stacked chip 73 may be stacked over the first stacked chip 71 on the Y-axis to be shifted from disposition of the first stacked chip 71 by the length of the unit pad in the X direction of the X-axis. For example, as illustrated in FIG. 5 the second stacked chip 73 may be shifted to the right with regards to the X-axis. The third stacked chip 75 may be stacked over the second stacked chip 73 on the Y-axis to be shifted from disposition of the second stacked chip 73 by the predetermined distance in the second direction. For example, as illustrated, in FIG. 7, the third stacked chip 75 may be stacked over the second stacked chip 73 on the Y-axis to be shifted from disposition of the second stacked chip 73 by the length of the unit pad in the forward direction of the Z-axis. The fourth stacked chip 77 may be stacked over the third stacked chip 75 on the Y-axis to be shifted from disposition of the third stacked chip 75 by the predetermined distance in the third direction. For example, as illustrated in FIG. 7, the fourth stacked chip 77 may be stacked over the third stacked chip 75 on the Y-axis to be shifted from disposition of the third stacked chip 75 by the length of the unit pad in the right direction of the X-axis and by the length of the unit pad in the forward direction of the Z-axis.

The first through-via 721 of the first stacked chip 71 may be coupled to the first unit pad 711 of the first metal layer M1, and the first through-via 741 of the second stacked chip 73 may be electrically disconnected from the first metal layer M1 of the first stacked chip 71. Therefore, the first metal layers M1 and the first through-vias 721, 741, 761 and 781 of the first to fourth stacked chips 71, 73, 75 and 77 may form the electrical connection between the base chip 70 and the first stacked chip 71. The second through-via 722 of the first stacked chip 71 may be coupled to the first unit pad 712 of the second metal layer M2, and the second through-via 742 of the second stacked chip 73 may be coupled to the second unit pad 713 of the second metal layer M2 of the first stacked chip 71. The second through-via 742 of the second stacked chip 73 may be coupled to the first unit pad 732 of the second metal layer M2 of the second stacked chip 73, and the second through-via 762 of the third stacked chip 75 may be electrically disconnected from the second metal layer M2 of the second stacked chip 73. Therefore, the second metal layers M2 and the second through-vias 722, 742, 762 and 782 of the first to fourth stacked chips 71, 73, 75 and 77 may form the electrical connection among the base chip 70, the first stacked chip 71 and the second stacked chip 73.

The third through-via 723 of the first stacked chip 71 may be coupled to the first unit pad 714 of the third metal layer M3, and the third through-via 743 of the second stacked chip 73 may be coupled to the second unit pad 715 of the third metal layer M3 of the first stacked chip 71. The third through-via 743 of the second stacked chip 73 may be coupled to the first unit pad 734 of the third metal layer M3 of the second stacked chip 73, and the third through-via 763 of the third stacked chip 75 may be coupled to the third unit pad 736 of the third metal layer M3 of the second stacked chip 73. The third through-via 763 of the third stacked chip 75 may be coupled to the first unit pad 754 of the third metal layer M3 of the third stacked chip 75, but the third through-via 783 of the fourth stacked chip 77 may be electrically disconnected from the third metal layer M3 of the third stacked chip 75. Therefore, the third metal layers M3 and the third through-vias 723, 743, 763 and 783 of the first to fourth stacked chips 71, 73, 75 and 77 may form the electrical connection among the base chip 70, the first stacked chip 71, the second stacked chip 73 and the third stacked chip 75.

The fourth through-via 724 of the first stacked chip 71 may be coupled to the first unit pad 717 of the fourth metal layer M4, and the fourth through-via 744 of the second stacked chip 73 may be coupled to the second unit pad 718 of the fourth metal layer M4 of the first stacked chip 71. The fourth through-via 744 of the second stacked chip 73 may be coupled to the first unit pad 737 of the fourth metal layer M4 of the second stacked chip 73, and the fourth through-via 764 of the third stacked chip 75 may be coupled to the third unit pad 739 of the fourth metal layer M4 of the second stacked chip 73. The fourth through-via 764 of the third stacked chip 75 may be coupled to the first unit pad 757 of the fourth metal layer M4 of the third stacked chip 75, and the fourth through-via 784 of the fourth stacked chip 77 may be coupled to the fourth unit pad 760 of the fourth metal layer M4 of the third stacked chip 75. Therefore, the fourth metal layers M4 and the fourth through-vias 724, 744, 764 and 784 of the first to fourth stacked chips 71, 73, 75 and 77 may form the electrical connection among the base chip 70 and the first to fourth stacked chips 71, 73, 75 and 77.

The base chip 70 may transmit a control signal for controlling only the first stacked chip 71 to the first stacked chip 71 through the first through-via 721 of the first stacked chip 71. The base chip 70 may transmit a control signal for controlling only the second stacked chip 73 to the second stacked chip 73 through the second through-via 722 of the first stacked chip 71. The base chip 70 may transmit a control signal for controlling only the third stacked chip 75 to the third stacked chip 75 through the third through-via 723 of the first stacked chip 71. The base chip 70 may transmit a control signal for controlling only the fourth stacked chip 77 to the fourth stacked chip 77 through the fourth through-via 724 of the first stacked chip 71. The control signal for controlling only the first stacked chip 71 may be transmitted to the first stacked chip 71 through the first through-via 721 of the first stacked chip 71. The control signal for controlling only the second stacked chip 73 may be transmitted to the second stacked chip 73 through the second through-vias 722 and 742 of the first stacked chip 71 and the second stacked chip 73. The control signal for controlling only the third stacked chip 75 may be transmitted to the third stacked chip 75 through the third through-vias 723, 743 and 763 of the first to third stacked chips 71, 73 and 75. The control signal for controlling only the fourth stacked chip 77 may be transmitted to the fourth stacked chip 77 through the fourth through-vias 724, 744, 764 and 784 of the first to fourth stacked chips 71, 73, 75 and 77. The first to fourth stacked chips 71, 73, 75 and 77 may additionally include a fourth metal pad and another through-via coupled to the fourth metal pad, which electrically couples all of the first to fourth stacked chips 71, 73, 75 and 77. Therefore, the additional through-via may serve as a signal path for a common signal for the first to fourth stacked chips 71, 73, 75 and 77.

The above described examples of embodiments illustrate that the through-via formed in each of the stacked chips are coupled to the first unit pad of the metal layer, which will not limit the scope of the present disclosure. For example, the through-via may be coupled to the second unit pad of each of the second to fourth metal layers, and the direction of the shift of each of the stacked chips may change accordingly. Also, the above described examples of embodiments illustrate the first to third directions, which may vary according to chip design, and the direction of the shift of each of the stacked chips may change according to the change of the first to third directions. Also, the above described examples of embodiments illustrate the shift stack structure of the first to fourth stacked chips, the number of which may vary. The present disclosure may also cover five or more stacked chips in the semiconductor apparatus.

The semiconductor apparatus discussed above (see FIGS. 1-7) are particular useful in the design of memory devices, processors, and computer systems. For example, referring to FIG. 8, a block diagram of a system employing the semiconductor apparatus in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 8:
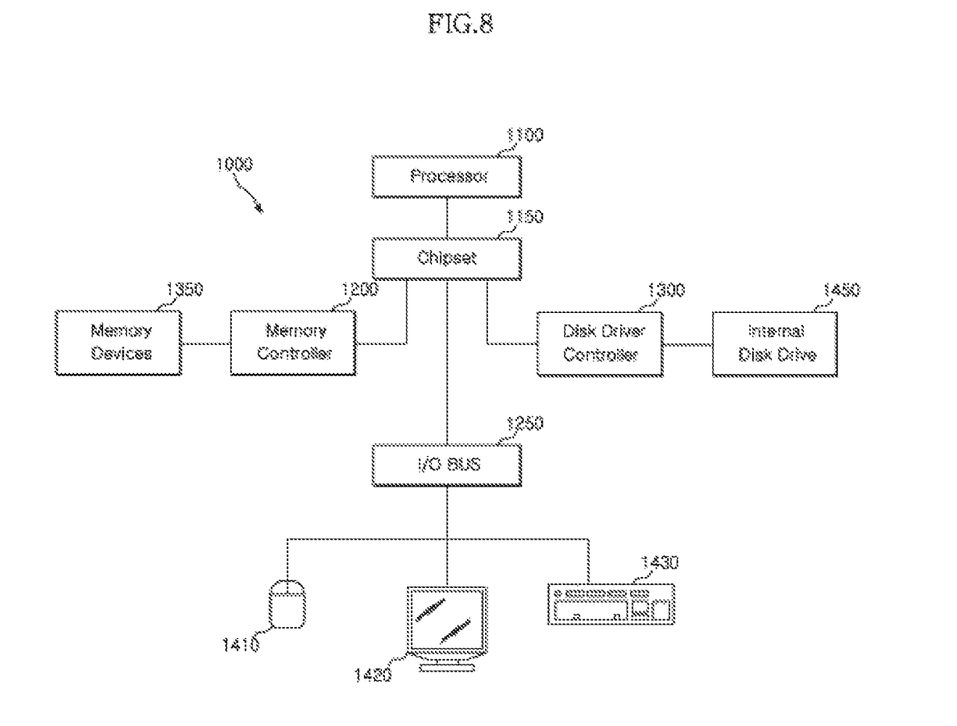
FIG. 8 illustrates a block diagram of an example of a representation of a system employing the semiconductor apparatus in accordance with the various embodiments discussed above with relation to FIGS. 1-7.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the semiconductor apparatus as discussed above with relation to FIGS. 1-7. In alternate embodiments, such as cellular phones or digital cameras, the components may differ from the embodiments illustrated in FIG. 8.

While certain embodiments have been described above, it will be understood to those skilled in the art that the embodiments described are by way of example only. Accordingly, the semiconductor apparatus having electrical connections with through-via and metal layer and stacking method thereof should not be limited based on the described embodiments. Rather, the semiconductor apparatus having electrical connections with through-via and metal layer and stacking method thereof described herein should only be limited in light of the claims that follow when taken in conjunction with the above description and accompanying drawings.

What is claimed is:

1. A semiconductor apparatus comprising:
a first stacked chip comprising a first metal layer including a first unit pad, and a second metal layer including a first unit pad and a second unit pad; and
a second stacked chip comprising a first metal layer including a first unit pad, and a second metal layer including a first unit pad and a second unit pad,
wherein the second unit pad of the second metal layer of the first stacked chip is disposed in a first direction from the first unit pad of the second metal layer of the first stacked chip, and is electrically coupled to the first unit pad of the second metal layer of the first stacked chip,
wherein the second unit pad of the second metal layer of the second stacked chip is disposed in the first direction from the first unit pad of the second metal layer of the second stacked chip, and is electrically coupled to the first unit pad of the second metal layer of the second stacked chip, and
wherein the second stacked chip is stacked over the first stacked chip and configured to be shifted from disposition of the first stacked chip by a predetermined distance which corresponds to length of the first unit pad in the first direction,
wherein the first stacked chip further comprises:
a first through via formed to penetrate the first stacked chip, and coupled to the first unit pad of the first metal layer of the first stacked chip; and
a second through via formed to penetrate the first stacked chip, and coupled to the first unit pad of the second metal layer of the first stacked chip, and
the first through-via of the first stacked chip is electrically disconnected from the second stacked chip.

2. The semiconductor apparatus of claim 1, wherein the second stacked chip further comprises:
a first through via formed to penetrate the second stacked chip, and coupled to the first unit pad of the first metal layer of the second stacked chip; and
a second through via formed to penetrate the second stacked chip, and coupled to the first unit pad of the second metal layer of the second stacked chip.

3. The semiconductor apparatus of claim 2, wherein the second through-via of the first stacked chip is electrically coupled to the second through-via of the second stacked chip through the second unit pad of the second metal layer of the first stacked chip.

4. The semiconductor apparatus of claim 1, wherein each of the first and second stacked chips further comprise a third metal layer comprising:
a first unit pad;

a second unit pad disposed in the first direction from the first unit pad of the corresponding metal layer, and is electrically coupled to the first unit pad of the corresponding metal layer; and a third unit pad disposed in a second direction from the first unit pad of the corresponding metal layer, and is electrically coupled to the first unit pad of the corresponding metal layer.

5. The semiconductor apparatus of claim 1, wherein the first unit pad of the first metal layer has substantially the same shape as the first and second unit pads of the second metal layer.

6. The semiconductor apparatus of claim 4, further comprising a third stacked chip comprising:
   a first metal layer including a first unit pad;
   a second metal layer including first and second unit pads; and
   a third metal layer including a first unit pad, a second unit pad and a third unit pad,
   wherein the second unit pad of the third metal layer of the third stacked chip is disposed in the first direction from the first unit pad of the second metal layer of the third stacked chip, and is electrically coupled to the first unit pad of the second metal layer of the third stacked chip,
   wherein the third unit pad of the third metal layer of the third stacked chip is disposed in the second direction from the first unit pad of the third metal layer of the third stacked chip, and is electrically coupled to the first unit pad of the third metal layer of the third stacked chip, and
   wherein the third stacked chip is stacked over the second stacked chip to be shifted from disposition of the second stacked chip by a predetermined distance in the second direction.

7. The semiconductor apparatus of claim 6,
   wherein the first stacked chip further comprises a third through via formed to penetrate the first stacked chip, and coupled to the first unit pad of the third metal layer of the first stacked chip,
   wherein the second stacked chip further comprises a third through via formed to penetrate the second stacked chip, and coupled to the first unit pad of the third metal layer of the second stacked chip, and
   wherein the third stacked chip further comprises a third through via formed to penetrate the third stacked chip, and coupled to the first unit pad of the third metal layer of the third stacked chip.

8. The semiconductor apparatus of claim 6, wherein each of the first to third stacked chips further comprise a fourth metal layer comprising:
   a first unit pad;
   a second unit pad disposed in the first direction from the first unit pad of the corresponding metal layer, and is electrically coupled to the first unit pad of the corresponding metal layer;
   a third unit pad disposed in the second direction from the first unit pad of the corresponding metal layer, and is electrically coupled to the first unit pad of the corresponding metal layer; and
   a fourth unit pad disposed in a third direction from the first unit pad of the corresponding metal layer, and is electrically coupled to the first unit pad of the corresponding metal layer.

9. The semiconductor apparatus of claim 7, wherein the second through-via of the second stacked chip is electrically disconnected from the third stacked chip.

10. The semiconductor apparatus of claim 7, wherein the third through-via of the second stacked chip is electrically coupled to the third through-via of the third stacked chip through the third unit pad of the third metal layer of the second stacked chip.

11. The semiconductor apparatus of claim 8, wherein the fourth unit pad is electrically coupled to the first unit pad of the corresponding metal layer through either the third unit pad of the corresponding metal layer or the second unit pad of the corresponding metal layer.

12. The semiconductor apparatus of claim 8, further comprising a fourth stacked chip comprising:
    a first metal layer including a first unit pad;
    a second metal layer including first and second unit pads;
    a third metal layer including a first unit pad, a second unit pad and a third unit pad; and
    a fourth metal layer including a first unit pad, a second unit pad, a third unit pad, and a fourth unit pad,
    wherein the second unit pad of the second metal layer of the fourth stacked chip is disposed in the first direction from the first unit pad of the second metal layer of the fourth stacked chip, and is electrically coupled to the first unit pad of the second metal layer of the fourth stacked chip,
    wherein the second unit pad of the third metal layer of the fourth stacked chip is disposed in the first direction from the first unit pad of the third metal layer of the fourth stacked chip, and is electrically coupled to the first unit pad of the third metal layer of the fourth stacked chip,
    wherein the third unit pad of the third metal layer of the fourth stacked chip is disposed in the second direction from the first unit pad of the third metal layer of the fourth stacked chip, and is electrically coupled to the first unit pad of the third metal layer of the fourth stacked chip,
    wherein the second unit pad of the fourth metal layer of the fourth stacked chip is disposed in the first direction from the first unit pad of the fourth metal layer of the fourth stacked chip, and is electrically coupled to the first unit pad of the fourth metal layer of the fourth stacked chip,
    wherein the third unit pad of the fourth metal layer of the fourth stacked chip is disposed in the second direction from the first unit pad of the fourth metal layer of the fourth stacked chip, and is electrically coupled to the first unit pad of the fourth metal layer of the fourth stacked chip,
    wherein the fourth unit pad of the fourth metal layer of the fourth stacked chip is disposed in third direction from the first and third unit pads of the fourth metal layer of the fourth stacked chip, and is electrically coupled to the first unit pad of the fourth metal layer of the fourth stacked chip, and
    wherein the fourth stacked chip is stacked over the third stacked chip and configured to be shifted from disposition of the third stacked chip by a predetermined distance in the third direction.

13. The semiconductor apparatus of claim 12,
    wherein the first stacked chip further comprises a fourth through via formed to penetrate the first stacked chip, and coupled to the first unit pad of the fourth metal layer of the first stacked chip,
    wherein the second stacked chip further comprises a fourth through via formed to penetrate the second stacked chip, and coupled to the first unit pad of the fourth metal layer of the second stacked chip, wherein the third stacked chip further comprises a fourth through via formed to penetrate the third stacked chip, and coupled to the first unit pad of the fourth metal layer of the third stacked chip, and wherein the fourth stacked chip further comprises a fourth through via formed to penetrate the fourth stacked chip, and coupled to the first unit pad of the fourth metal layer of the fourth stacked chip.

14. The semiconductor apparatus of claim 13, wherein the third through-via of the third stacked chip is electrically disconnected from the fourth stacked chip.

15. The semiconductor apparatus of claim 14, wherein the fourth through-via of the third stacked chip is electrically coupled to the fourth through-via of the fourth stacked chip through the fourth unit pad of the fourth metal layer of the third stacked chip.

* * * * *